Jan. 13, 1959
G. K. JENSEN ET AL
2,868,979
VARIABLE REACTANCE TUBE CIRCUIT
Filed Oct. 31, 1956
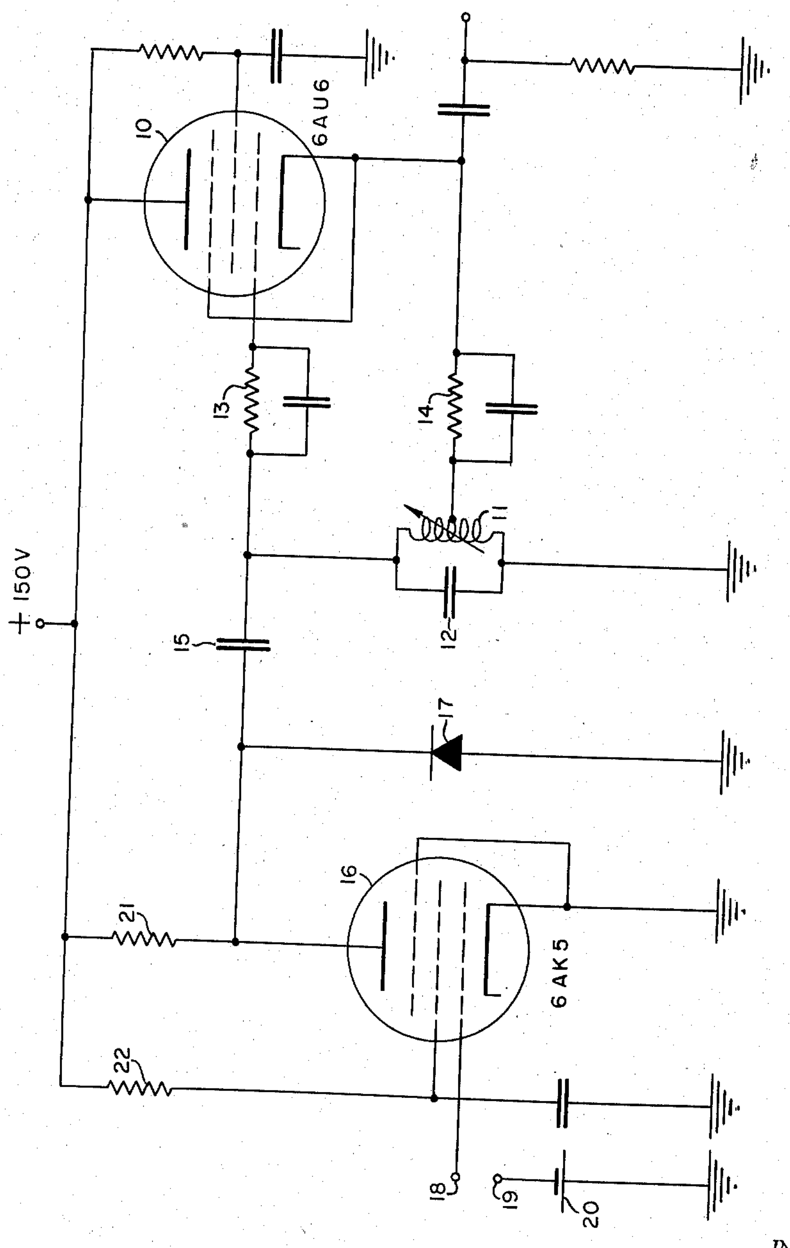
INVENTORS
GAROLD K. JENSEN
JAMES E. MC GEOGH
BY W R Maltby
Richard C Reed ATTORNEYS

United States Patent Office 2,868,979

Patented Jan. 13, 1959

2,868,979

VARIABLE REACTANCE TUBE CIRCUIT

Garold K. Jensen, Alexandria, Va., and James E. McGeogh, Silver Spring, Md., assignors to the United States of America as represented by the Secretary of the Navy Application October 31, 1956, Serial No. 619,647

6 Claims. (Cl. 250—36)

(Granted under Title 35, U. S. Code (1952), sec. 266)

The invention described herein may be manufactured and used by or for the Government of the United States of America for governmental purposes without the payment of any royalties thereon or therefor.

This invention relates to electrical frequency control devices and in particular to reactance tube circuits which are employed to control the frequency of operation of an electrical oscillator circuit.

In various applications of electronic circuits it is desirable to provide frequency control of an electrical signal. An oscillator which may be of the thermionic type may typically be used to generate an electrical signal having a desired average frequency. Control of this frequency to a particular value or purposeful variations of this frequency is easily effected mechanically by variation of a reactance device associated with the oscillatory circuit. In radio devices for example, it is quite common to employ a tuning condenser of variable capacity in shunt with an inductance to form an oscillator tank circuit wherein the frequency may be varied by adjustment of the tuning condenser. Such a manipulation is purely mechanical which in many instances is undesirable, either for convenience or because of inherent limitations on the rate of variation of the average frequency. Electronic frequency control of such an oscillator is not new, it being established practice to place a reactance tube across such a tuned circuit, the effect of which is to provide electronic variation of the oscillator tank circuit parameters so that frequency variation of the oscillator can be effected merely by the variation of a control voltage applied to the reactance tube.

All prior reactance tube circuits suffer from various limitations which manifest themselves as restriction in the frequency range over which an oscillator may be varied. In one form of reactance tube circuit for example, a phase shift device is employed to provide an exciting voltage for the reactance tube grid which is 90 degrees out of phase with the voltage developed across the oscillator tank circuit. The plate of the reactance tube is then connected across the oscillator tank circuit and by virtue of the 90 degree phase shift in grid driving voltage a reactive anode current is drawn by the reactance tube. Such an arrangement effectively placed an additional reactance in the oscillator tank circuit which serves to vary the oscillatory frequency thereof. Such a circuit although it is in widespread use is not readily adaptable to changes in the average frequency of the oscillatory signal because of the fact that the phase shift circuit is inherently frequency selective and will produce its desired 90 degree phase shift only at a particular operating frequency.

Another form of prior art reactance tube circuit employs the tube in a shunt path across the oscillatory circuit wherein the anode circuit of the tube is placed in series with a capacitance. In such a circuit when the anode resistance of the tube is very low, the capacitance is effectively in shunt with the oscillatory circuit to produce low frequency operation. In the other extreme of resistance of the anode of the reactance tube the high anode resistance will effectively prevent the passage of any substantial amount of current through the capacitor thus effectively reducing the capacitance across the tube circuit raising the frequency thereof. Such a circuit has certain advantages in that it is not as frequency selective as the phase shift type of reactance circuit; however, in the past it has been found impossible to obtain extremely wide frequency variation of the oscillatory circuit.

The reason for the limitation of frequency range in the second form of circuit has now been discovered and an improved circuit has been provided possessing vastly improved characteristics as evidenced by a very wide range of operation both in the sense of range over which the average frequency may be varied and in the range over which frequency variations are possible electronically. A typical embodiment of the features of the present invention is shown in the single figure of the drawing to which attention is now directed.

The circuit disclosed includes an electron tube 10 which is typically connected in a Hartley type circuit employing a tapped inductance 11 and resonating capacitance 12. Biasing for tube 10 is provided by the grid-leak circuit 13 and the cathode circuit 14. Oscillatory output typically is derived at the cathode of tube 10 although it is obvious that there are other points in the circuit which may be used to advantage in particular specific applications. For example, output may be derived at the anode of tube 10 if appropriate connections are made. Across the tank circuit of elements 11 and 12 is connected a shunting circuit comprising capacitance 15 which is placed in series with the anode circuit of tube 16, the latter being shunted by a unilateral impedance device 17. Unilateral impedance device 17 is polarized in such manner as to permit conductance thereby whenever the anode of tube 16 would otherwise be driven below ground potential.

The control grid of tube 16 is connected to a source of control voltage at terminal 18, the source of control voltage normally also being connected through a suitable coupling circuit to terminal 19 whereas bias for the grid of tube 16 may be provided typically by a battery 20. The circuit thus far described employs the tube 16 merely as a variable resistance device which is in series with capacitance 15 to control the effective amount of capacitive reactance in shunt with inductance 11 to vary the frequency of operation of the oscillator circuit.

Impedance element 17 is an important addition to the prior circuit providing a substantial increase in the range of control possible over the oscillatory circuit. To obtain wide range variation it is important that tube 16 provide a wide range of anode circuit impedance variation so that capacitance 15 may be virtually removed from the circuit in one extreme and yet virtually in direct shunt across the tank circuit in the other extreme. A high anode impedance is readily obtained with a pentode in the position of tube 16, however a low anode impedance is not. In this circuit tube 16 is driven below the "knee" of the pentode characteristic curve by the appropriate selection of anode voltage supply, screen and anode resistors and grid control voltage. In this region of operation, tube 16 exhibits the triode characteristic of low anode circuit resistance, typically as low as 150 ohms for a 6AK5 tube.

This region of operation of tube 16, below the "knee" of the characteristic curve is inherently accompanied by a low anode voltage, typically of the order of 25 volts. This produces complications because the oscillatory voltage developed across the tank circuit will normally have peak amplitude in excess of 25 volts resulting in the driving of the anode potential of tube 16 below ground potential. When this occurs, tube 16 ceases conduction, effectively removing the capacitance 15 from the circuit during a large portion of each cycle of the oscillatory voltage so that the net effect of capacitance 15 on frequency variation is reduced.

This disadvantage is avoided by the unilateral impedance element 17 which becomes conductive at such times to effectively retain capacitance 15 across the tank circuit for the entire oscillatory cycle.

Practical circuits embodying the teachings of the present invention have been found to provide more than double the frequency variation obtainable with prior circuits and are readily tunable over much wider average frequency ranges since the only frequency selective circuit is the tank circuit itself. Tuning of the tank circuit can be accomplished by any conventional means, however a wide control range is more readily obtained with a high impedance tank circuit which would normally suggest variation of inductance 11.

The following are typical component identification and values providing typical result.

| | |
|---|---|
| Element **17** | Type 1N39 crystal. |
| Tube **10** | Type 6AU6. |
| Tube **16** | Type 6AK5. |
| Resistance **21** | 82K ohms. |
| Resistance **22** | 5K ohms. |
| Capacitance **12** | 10 micro-micro farads. |
| Capacitance **15** | 20 micro-micro farads. |
| Inductance **11** | 25 micro-henries @ 10 megacycles to 2.5 millihenries @ 1 megacycle. |
| Center frequency tuning range | 1–10 megacycles. |
| Center frequency electronic variation | 2 megacycles (at 10 megacycles center). |

Obviously many modifications and variations of the present invention are possible in the light of the above teachings. It is therefore to be understood that within the scope of the appended claims the invention may be practiced otherwise than as specifically described.

What is claimed is:

1. Apparatus for producing a controllable frequency signal, comprising an oscillator having a reactive frequency determinative element, a secondary reactive element, a unilateral energy flow variable resistance device having anode and cathode elements, said device being connected in series with said secondary reactive element operative to control the energy flow in said secondary reactive element, means connecting said device and said secondary reactive element across at least part of said reactive frequency determinative element, and a unilateral energy flow impedance device, said unilateral energy flow impedance device having anode and cathode elements, the anode element thereof being directly connected to the cathode element of the variable resistance device and the cathode element being directly connected to the anode element of the variable resistance device whereby the unilateral energy flow impedance device becomes conductive whenever the potential of the anode of the variable resistance device becomes negative with respect to the cathode of the variable resistance device to effectively maintain said secondary reactive element in the circuit.

2. Apparatus in accordance with claim 1 wherein the reactive frequency determinative element includes a device having capacitative reactance.

3. Apparatus in accordance with claim 1 wherein the reactive frequency determinative element includes a device having inductive reactance.

4. Apparatus in accordance with claim 1 wherein the reactive frequency determinative element is a tuned circuit having components for providing inductive and capacitative reactance.

5. Apparatus in accordance with claim 1 wherein the secondary reactive element includes a device having capacitative reactance.

6. Apparatus in accordance with claim 1 wherein the unilateral energy flow variable resistance device is a multi-grid electron tube.

References Cited in the file of this patent

UNITED STATES PATENTS

| | | |
|---|---|---|
| 2,588,551 | McCoy | Mar. 11, 1952 |
| 2,708,739 | Bucher | May 17, 1955 |
| 2,748,284 | Segerstrom | May 29, 1956 |